(12) United States Patent
Sato et al.

(10) Patent No.: US 9,627,246 B2
(45) Date of Patent: Apr. 18, 2017

(54) METHOD OF FORMING SHALLOW TRENCH ISOLATION (STI) STRUCTURES

(71) Applicant: Microchip Technology Incorporated, Chandler, AZ (US)

(72) Inventors: Justin Hiroki Sato, West Linn, OR (US); Gregory Allen Stom, Demascus, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/735,359

(22) Filed: Jun. 10, 2015

(65) Prior Publication Data
US 2016/0365272 A1 Dec. 15, 2016

(51) Int. Cl.
| | | |
|---|---|---|
| *H01L 21/70* | (2006.01) | |
| *H01L 21/762* | (2006.01) | |
| *H01L 21/02* | (2006.01) | |
| *H01L 21/311* | (2006.01) | |
| *H01L 21/306* | (2006.01) | |
| *H01L 21/3105* | (2006.01) | |
| *H01L 29/06* | (2006.01) | |
| *H01L 21/8234* | (2006.01) | |

(52) U.S. Cl.
CPC .. *H01L 21/76224* (2013.01); *H01L 21/30604* (2013.01); *H01L 21/31051* (2013.01); *H01L 21/31111* (2013.01); *H01L 21/823481* (2013.01); *H01L 29/0649* (2013.01)

(58) Field of Classification Search
CPC ....... H01L 21/76224; H01L 21/823481; H01L 21/30604; H01L 21/31111; H01L 29/0649; H01L 21/31051

USPC .......................................... 438/424
See application file for complete search history.

(56) References Cited

U.S. PATENT DOCUMENTS 5,026,666 A * 6/1991 Hills ................. H01L 21/31116
  216/38
5,332,694 A * 7/1994 Suzuki ............. H01L 21/76802
  257/E21.245

(Continued)

OTHER PUBLICATIONS

International Search Report and Written Opinion, Application No. PCT/US2016/035785, 11 pages, Sep. 16, 2016.

*Primary Examiner* — Long K Tran
*Assistant Examiner* — Thai T Vuong
(74) *Attorney, Agent, or Firm* — Slayden Grubert Beard PLLC

(57) ABSTRACT

A method of forming a trench isolation (e.g., an STI) for an integrated circuit includes forming a pad oxide layer and then a nitride layer over a semiconductor substrate, performing a trench etch through the structure to form a trench, depositing a trench oxide layer over the structure to form a filled trench, depositing a sacrificial planarizing layer, which is etch-selective to the trench oxide layer, over the deposited oxide, performing a planarizing etch process that removes the sacrificial planarizing layer and decreases surface variations in an upper surface of the trench oxide layer, performing an oxide etch process that is selective to the trench oxide layer to remove remaining portions of the trench oxide layer outside the filled trench, and removing the remaining nitride layer such that the remaining oxide-filled trench defines a trench isolation structure that projects above an exposed upper surface of the semiconductor substrate.

16 Claims, 15 Drawing Sheets

(56) References Cited

U.S. PATENT DOCUMENTS

| | | | |
|---|---|---|---|
| 5,506,168 A * | 4/1996 | Morita | H01L 21/76237 |
| | | | 257/E21.551 |
| 6,020,621 A * | 2/2000 | Wu | H01L 21/76235 |
| | | | 257/506 |
| 2001/0053583 A1 | 12/2001 | Fang et al. | 438/424 |
| 2002/0168834 A1 | 11/2002 | Chen et al. | 438/427 |
| 2003/0054654 A1 | 3/2003 | Feng-Chen et al. | 438/700 |
| 2009/0280618 A1 | 11/2009 | Ali et al. | 438/424 |

* cited by examiner

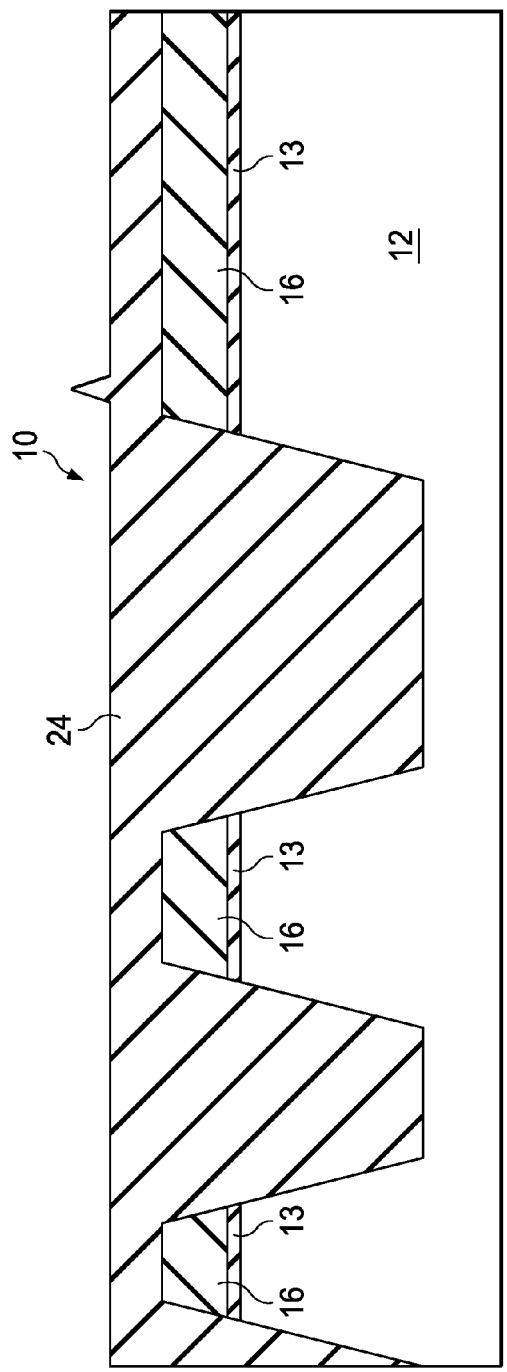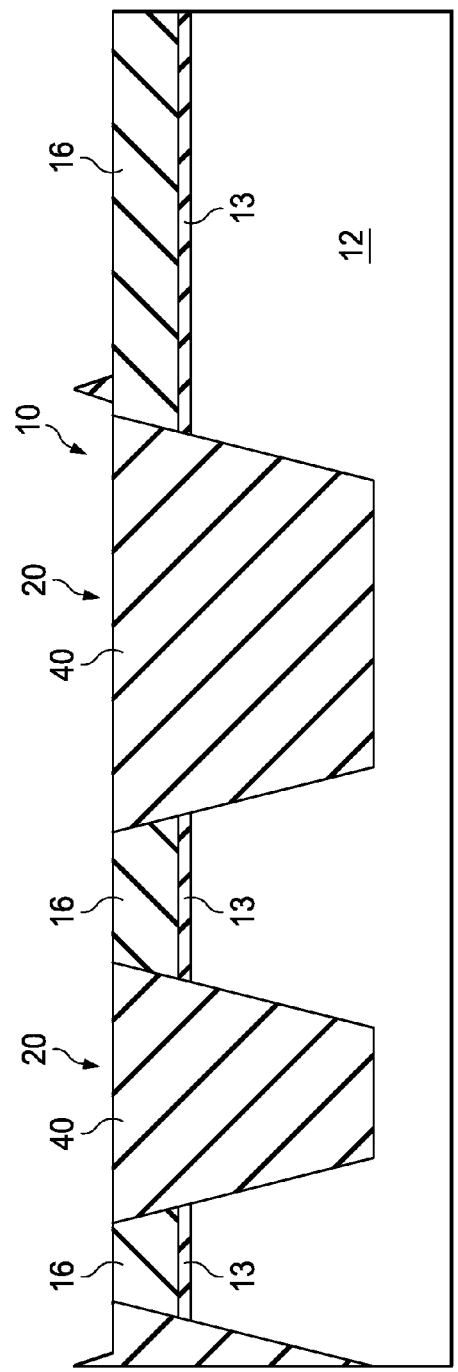

METHOD OF FORMING SHALLOW TRENCH ISOLATION (STI) STRUCTURES

TECHNICAL FIELD

The present disclosure relates to semiconductor integrated circuit (IC) fabrication, and more particularly, to methods of forming shallow trench isolation structures (STIs), e.g., for a complementary metal-oxide semiconductor (CMOS) device.

BACKGROUND

Shallow trench isolation (STI) is an integrated circuit feature that prevents electrical current leakage between adjacent semiconductor device components. STI structures are commonly used in CMOS devices, and are typically formed early during the semiconductor device fabrication process, before transistors are formed. The key steps of a conventional STI process involve etching a pattern of trenches in a silicon substrate, depositing one or more dielectric materials (e.g., silicon dioxide) to fill the trenches, and removing the excess dielectric using chemical-mechanical planarization (CMP).

However, the CMP processing involved in conventional STI formation may cause one or more related problems. For example, the CMP process may produce a significant center-to-edge bias that may result in sufficient variation across the wafer to cause yield fallout. As another example, CMP may cause localized non-uniformity and dishing of the field oxide. Further, the CMP process may leave oxide residue on the largest active areas, which may cause SiN residue that results in yield loss. Finally, the conventional STI formation processing using CMP involves a relatively large number of steps.

SUMMARY

According to the teachings of this disclosure, trench isolation structures, e.g., shallow trench isolations (STIs), can be formed without using CMP and/or with a reduced number of steps as compared with conventional techniques.

In one embodiment, a method of forming a trench isolation structure (e.g., an STI) for an integrated circuit includes: forming a thin pad oxide layer then a nitride layer over a semiconductor substrate; performing a trench etch process through portions of the nitride layer, pad oxide, and the semiconductor substrate to form a trench; depositing a trench oxide layer over remaining portions of the nitride layer and extending into the trench to form a filled trench; depositing a sacrificial planarizing layer over the deposited oxide, the sacrificial planarizing layer being etch-selective with respect to the trench oxide layer; performing a planarizing etch process that removes the sacrificial planarizing layer and decreases surface variations in an upper surface of the trench oxide layer; performing an oxide etch process that is selective to the trench oxide layer to remove remaining portions of the trench oxide layer outside the filled trench; and performing a nitride removal process that removes the remaining portions of the nitride layer such that the remaining oxide of the filled trench defines a trench isolation structure that projects above an exposed upper surface of the semiconductor substrate. This technique can of course be used to form a plurality of trench isolation structures as desired.

In another embodiment, a semiconductor die may include a semiconductor substrate and a plurality of trench isolation structures (e.g., STIs) formed in the semiconductor substrate by a process including: forming a thin pad oxide layer then a nitride layer over the semiconductor substrate; performing a trench etch process through portions of the nitride layer, pad oxide, and the semiconductor substrate to form a plurality of trenches; depositing a trench oxide layer over remaining portions of the nitride layer and extending into the trenches to form a plurality of filled trenches; depositing a sacrificial planarizing layer over the deposited oxide, the sacrificial planarizing layer being etch-selective with respect to the trench oxide layer; performing a planarizing etch process that removes the sacrificial planarizing layer and decreases surface variations in an upper surface of the trench oxide layer; performing an oxide etch process that is selective to the trench oxide layer to remove remaining portions of the trench oxide layer outside the filled trenches; and performing a nitride removal process that removes the remaining portions of the nitride layer such that the remaining oxide of each filled trench defines a trench isolation structure that projects above an exposed upper surface of the semiconductor substrate.

In other embodiments, a CMOS device comprises a semiconductor structure including a plurality of trench isolation structures formed as discussed above.

In some embodiments, the sacrificial planarizing layer comprises an organosilicate. In particular embodiments, the sacrificial planarizing layer comprises an organo-siloxane based polymer, e.g., according to the chemical formula $R_xCH_{3y}SiO_z$, where R is an organic chromophore. For example, in some embodiments the sacrificial planarizing layer may comprise a DUO™ 193 or DUO™ 248 anti-reflective coating supplied by Honeywell Electronic Materials, having a location at 101 Columbia Rd, Morristown, N.J. 07960.

BRIEF DESCRIPTION OF THE FIGURES

Example embodiments are discussed below with reference to the drawings, in which:

FIGS. 1A-1H illustrate a cross-section of an example semiconductor integrated circuit structure, showing a step-by-step process of forming trench isolation structures (e.g., STIs) for an integrated circuit, according to an example embodiment of the invention;

DETAILED DESCRIPTION

Figure 1A:
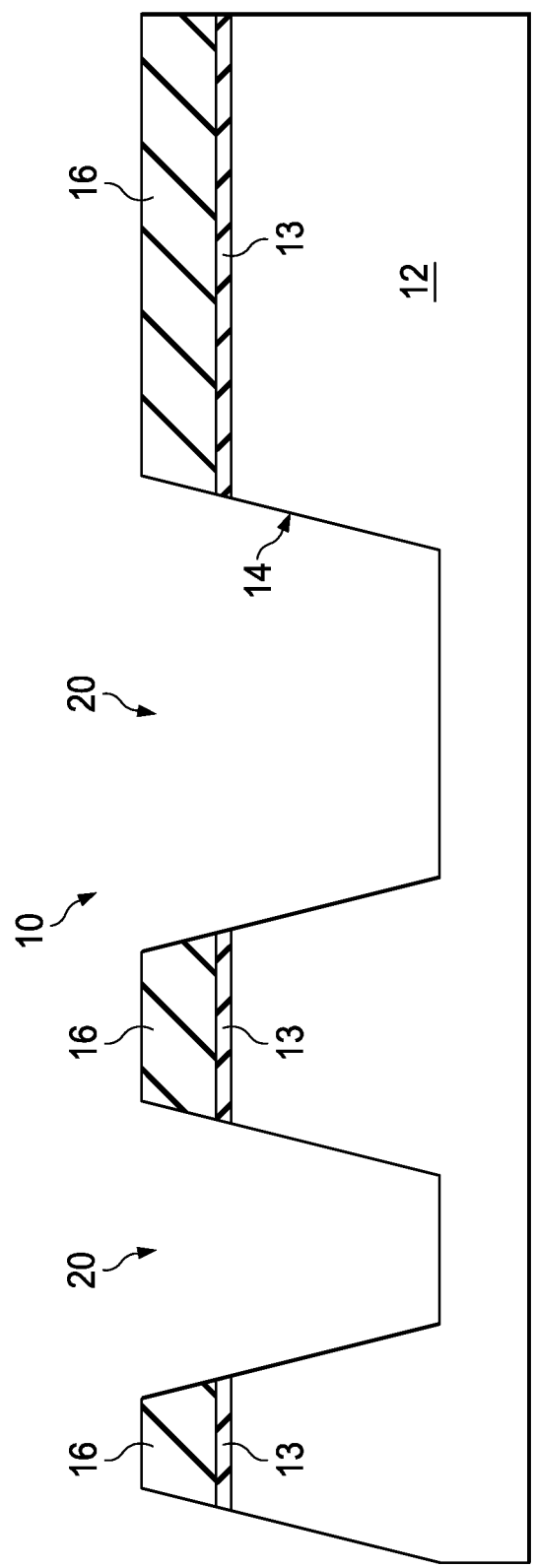

According to the teachings of this disclosure, trench isolation structures, e.g., shallow trench isolations (STIs), can be formed without using CMP and/or with a reduced number of steps as compared with conventional techniques. Such process may reduce or eliminate one or more problems related to CMP processing, and/or may reduce cost and complexity of forming STIs.

Referring now to the drawings, the details of specific example embodiments are schematically illustrated. Like elements in the drawings will be represented by like numbers, and similar elements will be represented by like numbers with a different lower case letter suffix.

FIGS. 1A-1H illustrate the steps of an example process of forming trench isolation structures (e.g., STIs) for an integrated circuit, e.g., a CMOS device, according to an example embodiment.

As shown in FIG. 1A, an integrated circuit structure 10 includes a semiconductor substrate 12, e.g., a silicon (Si) substrate, formed on a wafer surface. An oxide layer 13, e.g., a thin pad oxide layer of silicon dioxide ($SiO_2$), is formed or deposited over the semiconductor substrate 12 to help stress/adhesion of the nitride to the substrate. A nitride layer 16, e.g., silicon nitride (SiN), is deposited over the pad oxide layer 13, and a trench etch process, e.g., an STI etch, is performed through portions of the nitride layer 16, pad oxide layer 13, and the semiconductor substrate 12 to form one or more trenches 20, using any suitable photolithography techniques. The oxide layer 13 may be formed or deposited prior to the nitride layer 16 to help stress/adhesion of the nitride to the substrate, and may have a thickness of about 1/10 the thickness of the deposited nitride layer 16. After the etch, a liner oxidation may form a liner oxide layer 14 on the exposed surfaces of the semiconductor substrate 12.

Figure 1B:
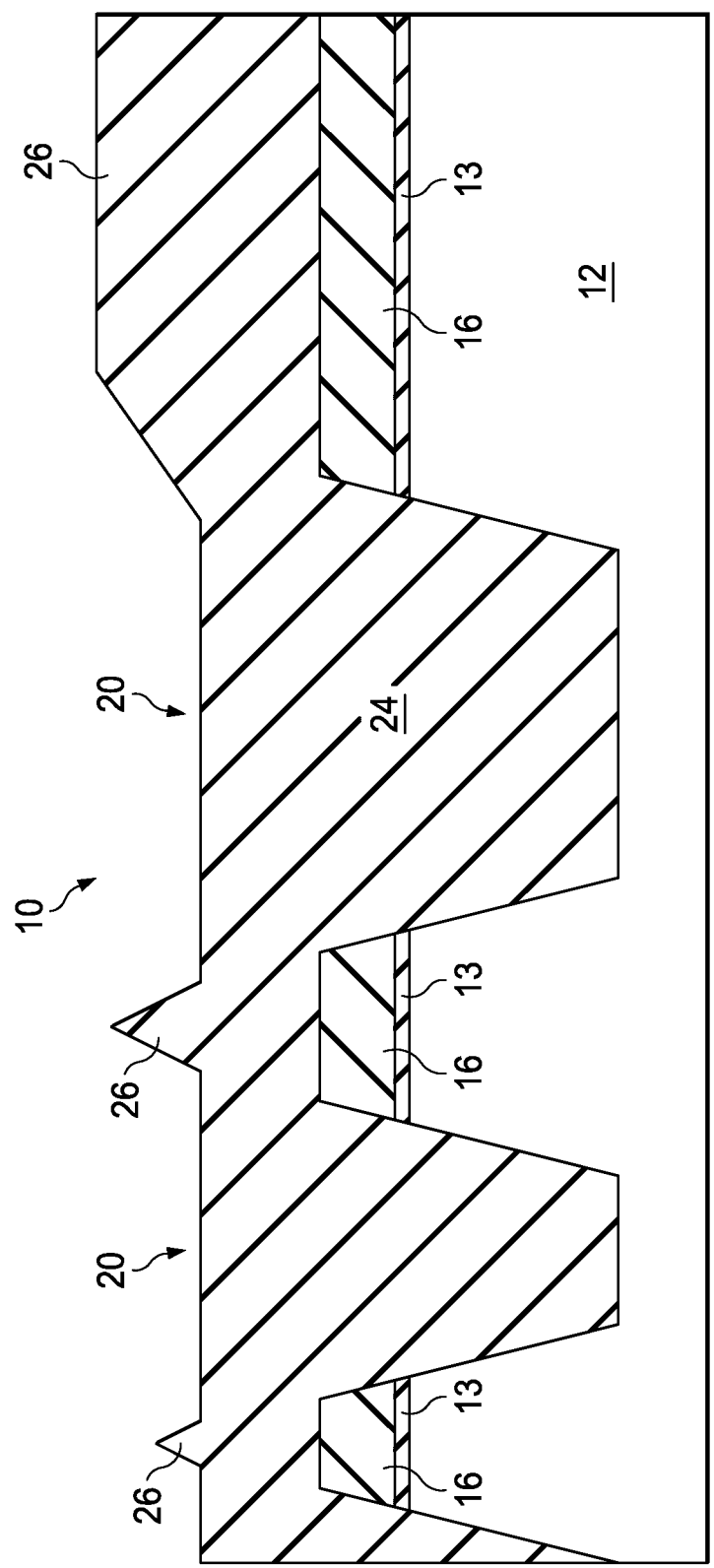

As shown in FIG. 1B, a trench oxide layer 24, e.g., silicon dioxide ($SiO_2$), is deposited over the structure, and extends into each trench 20 to form filled trenches. In some embodiments, the trench oxide layer 24 is deposited by High-Density Plasma Chemical Vapor Deposition (HDP CVD). As shown, the deposited trench oxide layer 24 may have a non-planar topography, e.g., due to the topography of the underlying structure. In particular, the topography of the trench oxide layer 24 may define a number of upwardly protruding or extending features or regions 26.

Figure 1C:
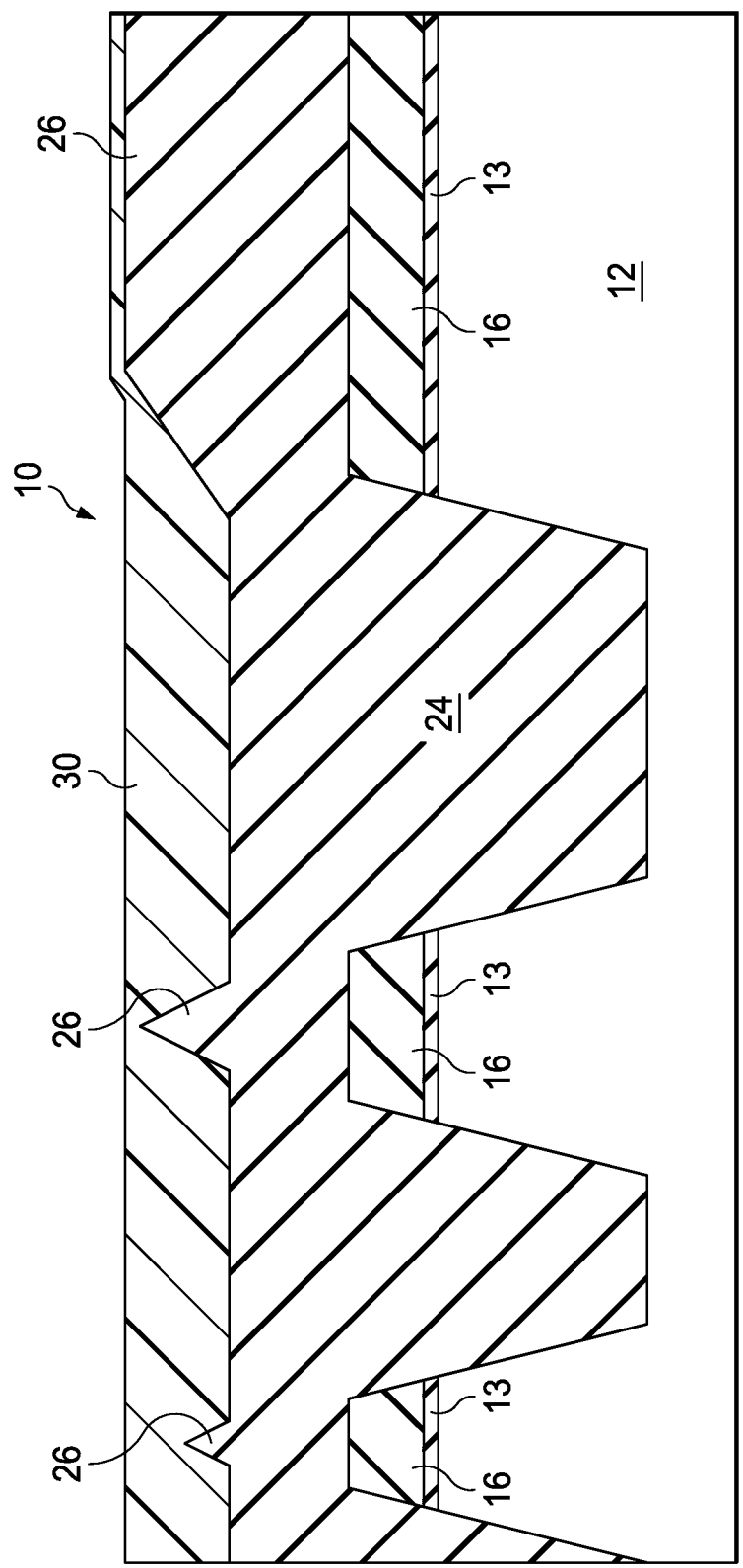

As shown in FIG. 1C, a sacrificial planarizing layer 30 is deposited over the trench oxide layer 24. The sacrificial planarizing layer 30 is etch-selective with respect to the trench oxide layer 24. In some embodiments, the planarizing layer comprises an organosilicate. For example, the planarizing layer 30 may comprise an organo-siloxane based polymer, e.g., an organo-siloxane based polymer with the chemical formula $R_xCH_{3y}SiO_z$, where R is an organic chromophore. In example embodiments, the sacrificial planarizing layer 30 comprises a DUO™ 193 or DUO™ 248 anti-reflective coating supplied by Honeywell Electronic Materials, having a location at 101 Columbia Rd, Morristown, N.J. 07960. The planarizing layer 30 may be deposited in any suitable manner. In some embodiments, planarizing layer 30 is spin-coated over the trench oxide layer 24, which provides a partially planarizing effect.

A planarizing etch process is then performed to remove the sacrificial planarizing layer 30 and decrease surface variations in the upper surface of the trench oxide layer 24, e.g., by reducing or eliminating the upwardly protruding or extending features or regions 26. The planarizing etch process may include a single etch process or a series of different etch processes. In the example discussed below, the planarizing etch process shown in FIGS. 1D and 1E involves three different etches.

Figure 1D:
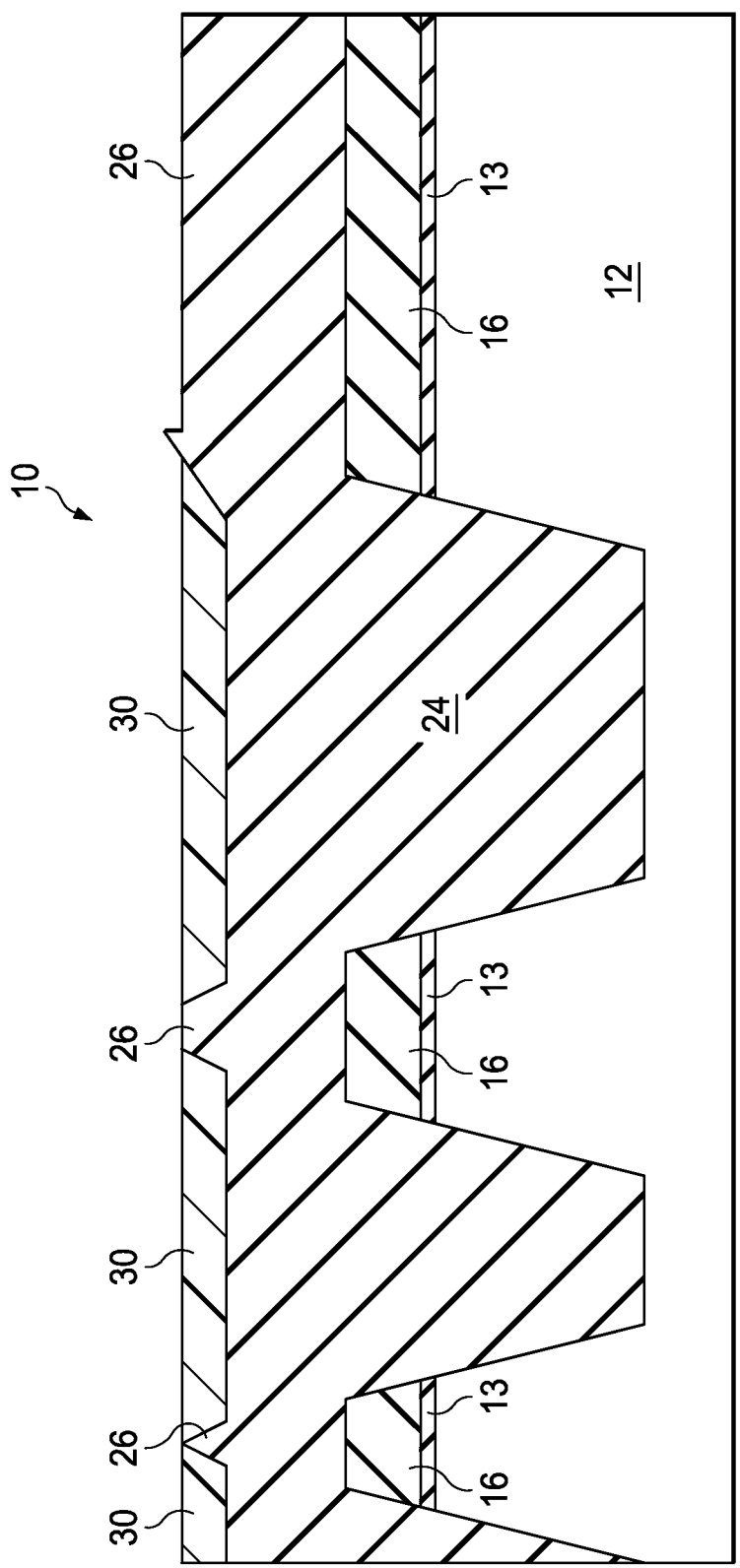

Referring to FIG. 1D, the wafer is etched in an oxide etcher, first with a tuned etch to open the planarizing layer, and then with a short oxide etch selective to the trench oxide layer 24. The second etch will cause the upwardly projecting oxide areas 26 to be etched, while the lower field areas of the oxide layer 24 are protected by the sacrificial planarizing layer 30. In one embodiment, the second etch is stopped when the highest points 26 are about level with the bulk planarizing layer 30.

In the present document, an etch process that etches through a first substance/layer faster than a second substance/layer is said to be "selective to" the first substance/layer over the second substance/layer.

Referring to FIG. 1E, a third etch is then performed, which is non-selective with respect to the trench oxide layer 24 and sacrificial planarizing layer 30, to remove the trench oxide layer 24 and sacrificial planarizing layer 30 at similar rates, until the planarizing layer 30 is removed. This etch may be stopped before reaching the nitride layer 16, as shown in FIG. 1E.

As shown in FIG. 1F, an oxide etch that is highly selective to the trench oxide layer 24 is then performed to remove remaining portions of the trench oxide layer 24 outside the filled trenches 20, thereby defining a field oxide 40 in each trench 20. In some embodiments, a defined amount of over-etch is performed, which may trench the field oxides 40 and clear any residue on the remaining nitride layer 16.

Figure 1G:
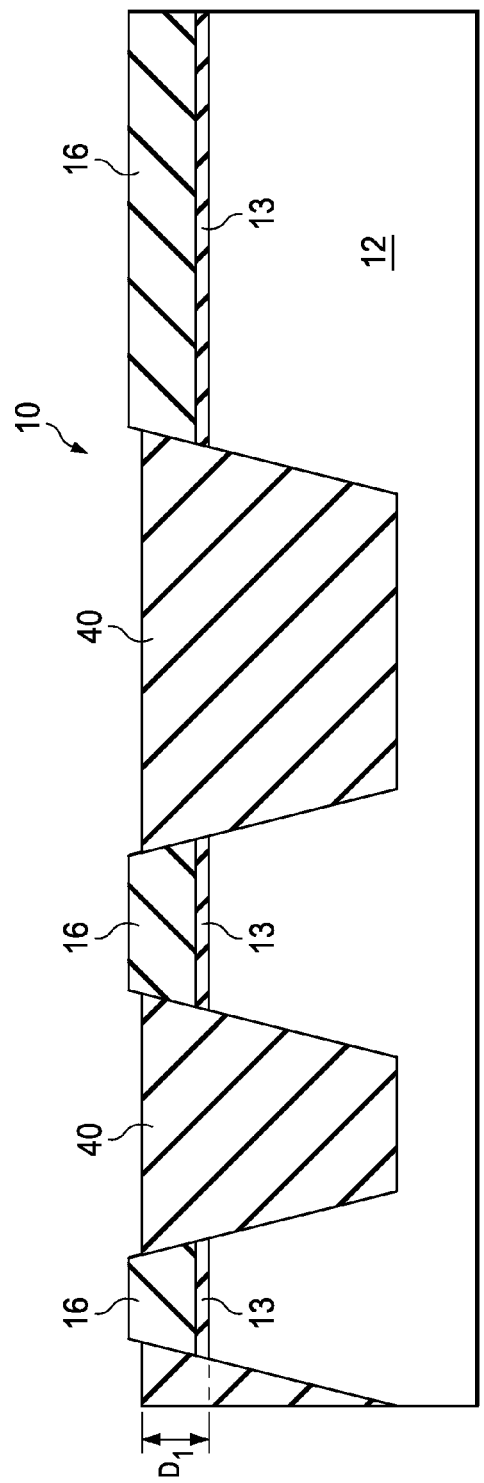

As shown in FIG. 1G, an optional wet etch is performed to remove oxide residue on the nitride layer 16 and/or to control the height of the field oxides 40. The wet etch may be designed to provide a defined height of the field oxides 40 relative to the top of the substrate 12, indicated as distance $D_1$ in FIG. 1G, which height may be selected in order to provide a final height of the field oxides 40, indicated as distance $D_2$ in FIG. 1H, based on knowledge of the height-reduction associated with subsequent processing steps.

Figure 1H:
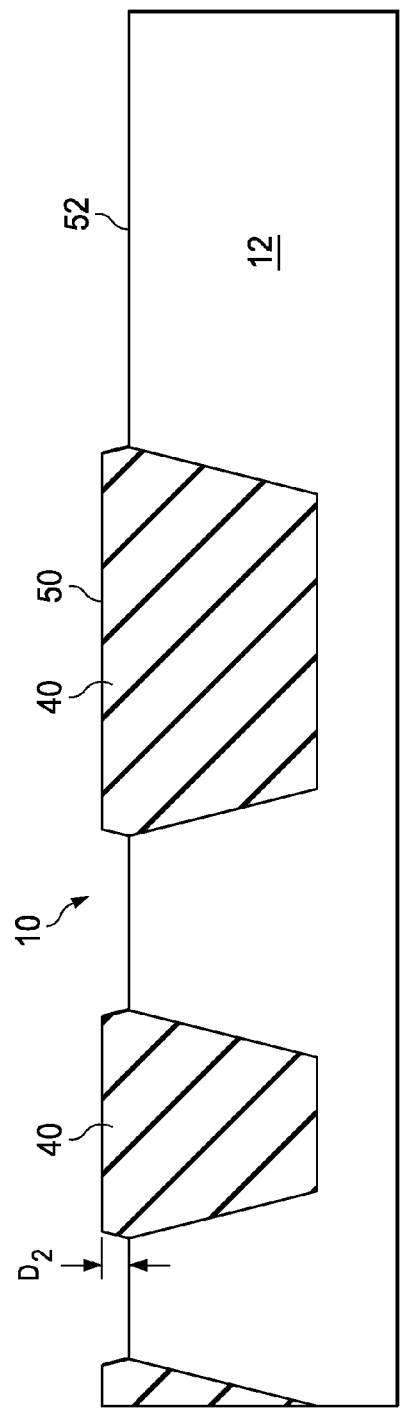

As shown in FIG. 1H, the nitride layer 16 is then removed using any suitable removal process, e.g., by an etch selective to the nitride layer 16 over the materials of the field oxide 40 and substrate 12. As shown, the remaining field oxides 40, i.e., trench isolation structures, may project above the exposed upper surface of the semiconductor substrate 12 by a targeted step height indicated at $D_2$, i.e., the height of the top surface of field oxide 40 relative to the top surface 52 of substrate 12. In some embodiments, step height $D_2$ and/or top shape of field oxides 40 may be controlled as desired by performing any suitable processes, e.g., plasma etch, wet etch, or by running a long wet removal process (e.g., wet SiN removal) to remove the remaining portions of the nitride layer 16.

Thus, in some embodiments, the trench isolation structures 40 (e.g., STIs) may be formed without using any chemical-mechanical planarization (CMP) process, which may provide various advantages as discussed above. The nitride removal step may also be performed in-situ with the rest of the planarizing etches, if the optional wet etch is skipped, thereby further reducing the total number of steps.

Figure 2:
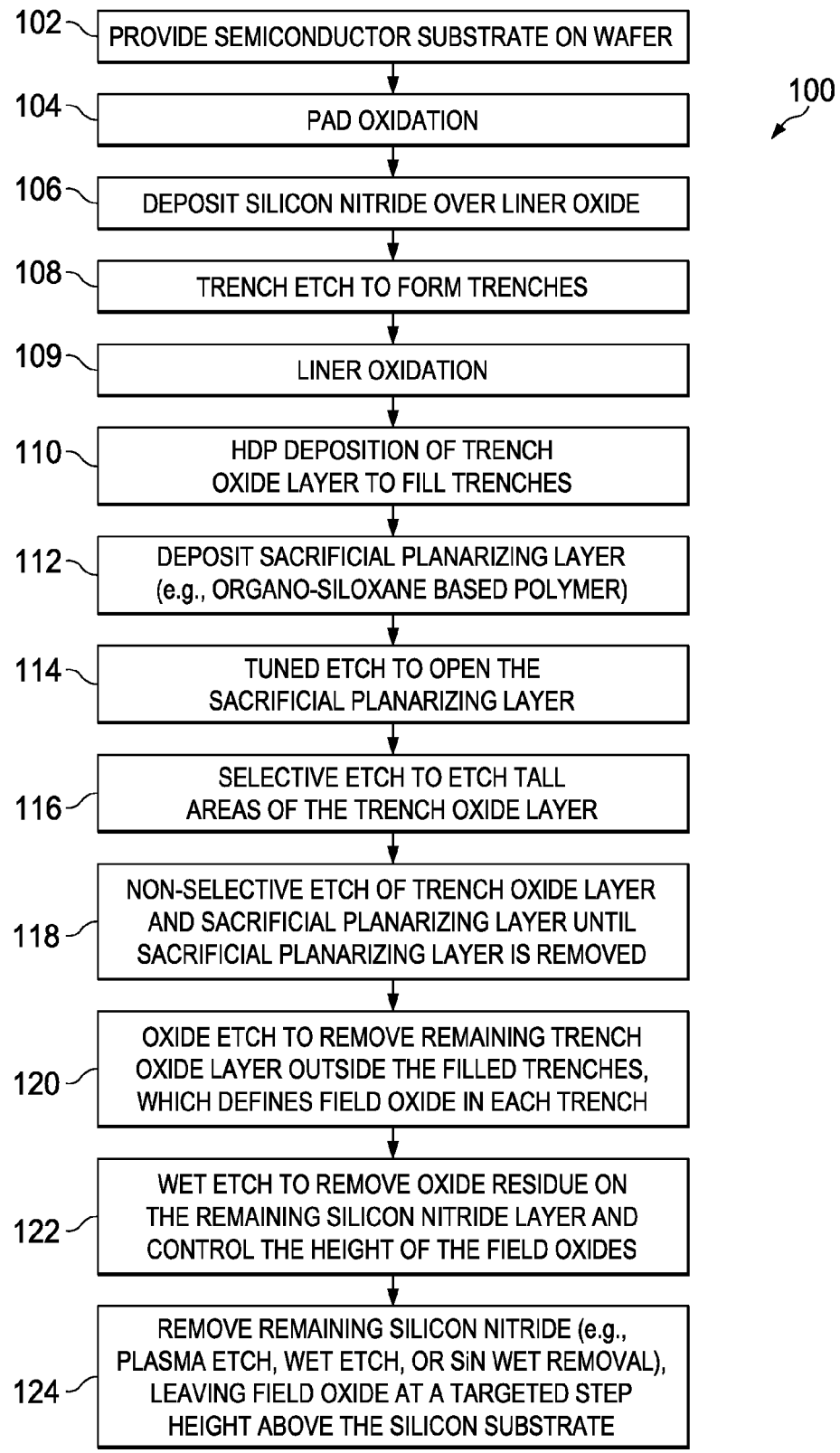
FIG. 2 is a flowchart of an example method of forming shallow trench isolations for an integrated circuit, e.g., CMOS device, corresponding to the process illustrated in FIGS. 1A-1H, according to an example embodiment.

FIG. 2 is a flowchart of an example method 100 of forming shallow trench isolations for an integrated circuit, e.g., CMOS device, according to an example embodiment corresponding to FIGS. 1A-1H. At step 102, a silicon substrate is formed on a wafer. At step 104, a pad oxidation process forms a pad oxide over the surface of the silicon substrate. At step 106, a silicon nitride layer is deposited over the silicon substrate. At step 108, a trench etch, e.g., an STI etch, is performed to form a plurality of trenches. At step 109, a liner oxidation process forms a liner oxide in the formed trenches. At step 110, a silicon dioxide layer (trench oxide layer) is deposited over the wafer by High-Density Plasma Chemical Vapor Deposition (HDP CVD), which fills the etched trenches. The deposited silicon dioxide layer may have a non-planar topography, e.g., due to the topography of the underlying structure. In particular, the silicon dioxide layer may define a number of upwardly protruding or extending features or regions.

At step 112, a sacrificial planarizing layer of an organosiloxane based polymer (e.g., DUO™ 193 or DUO™ 248) is deposited over the silicon dioxide layer. At step 114, a tuned etch is performed to open the sacrificial planarizing layer, followed by a short oxide etch selective to the silicon dioxide layer at step 116. The etch at step 116 may at least partially etch the upwardly projecting areas of the silicon dioxide, while the lower areas of silicon dioxide are protected by the sacrificial planarizing layer. At step 118, a non-selective etch is performed to etch through the silicon dioxide layer and sacrificial planarizing layer at similar rates, until the sacrificial planarizing layer is removed. This etch may be stopped before reaching the underlying silicon nitride layer.

At step 120, an oxide etch that is highly selective to silicon dioxide is then performed to remove portions of the silicon dioxide layer above and outside the filled trenches, thereby defining a field oxide in each trench. In some embodiments, a defined amount of over-etch is performed, which may trench the field oxides and clear any residue on the remaining silicon nitride layer. At step 122, an optional wet etch is performed to remove oxide residue on the remaining silicon nitride layer and/or to control the height of the field oxides. At step 124, the silicon nitride layer is removed using any suitable removal process, e.g., an etch selective to silicon nitride over the silicon dioxide field oxide and the silicon substrate. The remaining field oxides, i.e., trench isolation structures, may project above the exposed upper surface of the silicon substrate by a targeted step height, which may be controlled or shaped as desired using any suitable finishing process(es).

Thus, in this manner, shallow trench isolations may be formed without using any chemical-mechanical planarization (CMP) process, which may provide various advantages as discussed above.

FIGS. 3A-3H illustrate the steps of another example embodiment of a process for forming trench isolation structures (e.g., STIs) for an integrated circuit, e.g., a CMOS device.

The initial steps of the process may be similar to those of the embodiment discussed above. Thus, the steps corresponding to FIGS. 3A-3C may be similar to those of FIGS. 1A-1C discussed above.

Figure 3A:
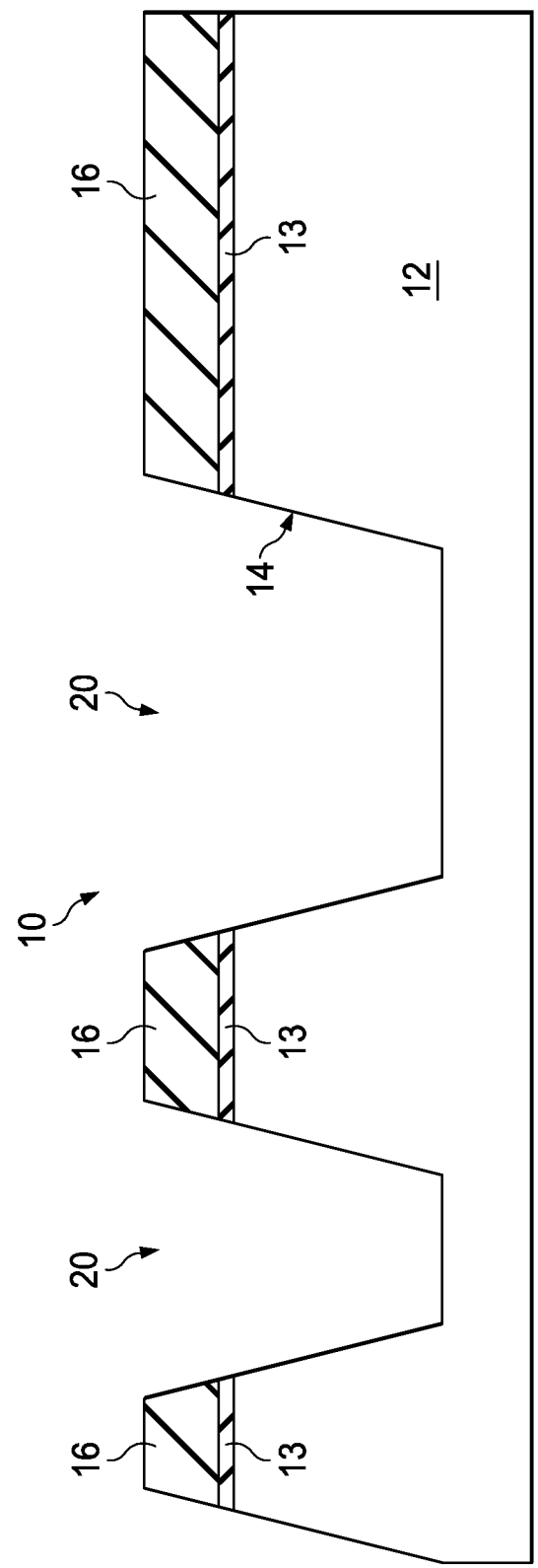
FIGS. 3A-3H illustrate a cross-section of another example semiconductor integrated circuit structure, showing a step-by-step process of forming trench isolation structures (e.g., STIs) for an integrated circuit, according to an example embodiment of the invention.

As shown in FIG. 3A, an integrated circuit structure 10 includes a semiconductor substrate 12, e.g., a silicon (Si) substrate, formed on a wafer surface. An oxide layer 13, e.g., a thin pad oxide layer of silicon dioxide ($SiO_2$), is formed or deposited over the semiconductor substrate 12 to help stress/adhesion of the nitride to the substrate. A nitride layer 16, e.g., silicon nitride (SiN), is deposited over the pad oxide layer 13, and a trench etch process, e.g., an STI etch, is performed through portions of the nitride layer 16, pad oxide layer 13, and the semiconductor substrate 12 to form one or more trenches 20, using any suitable photolithography techniques, e.g., as discussed above with reference to FIG. 1A. After the etch, a liner oxidation may form a liner oxide layer 14 on the exposed surfaces of the semiconductor substrate 12.

Figure 3B:
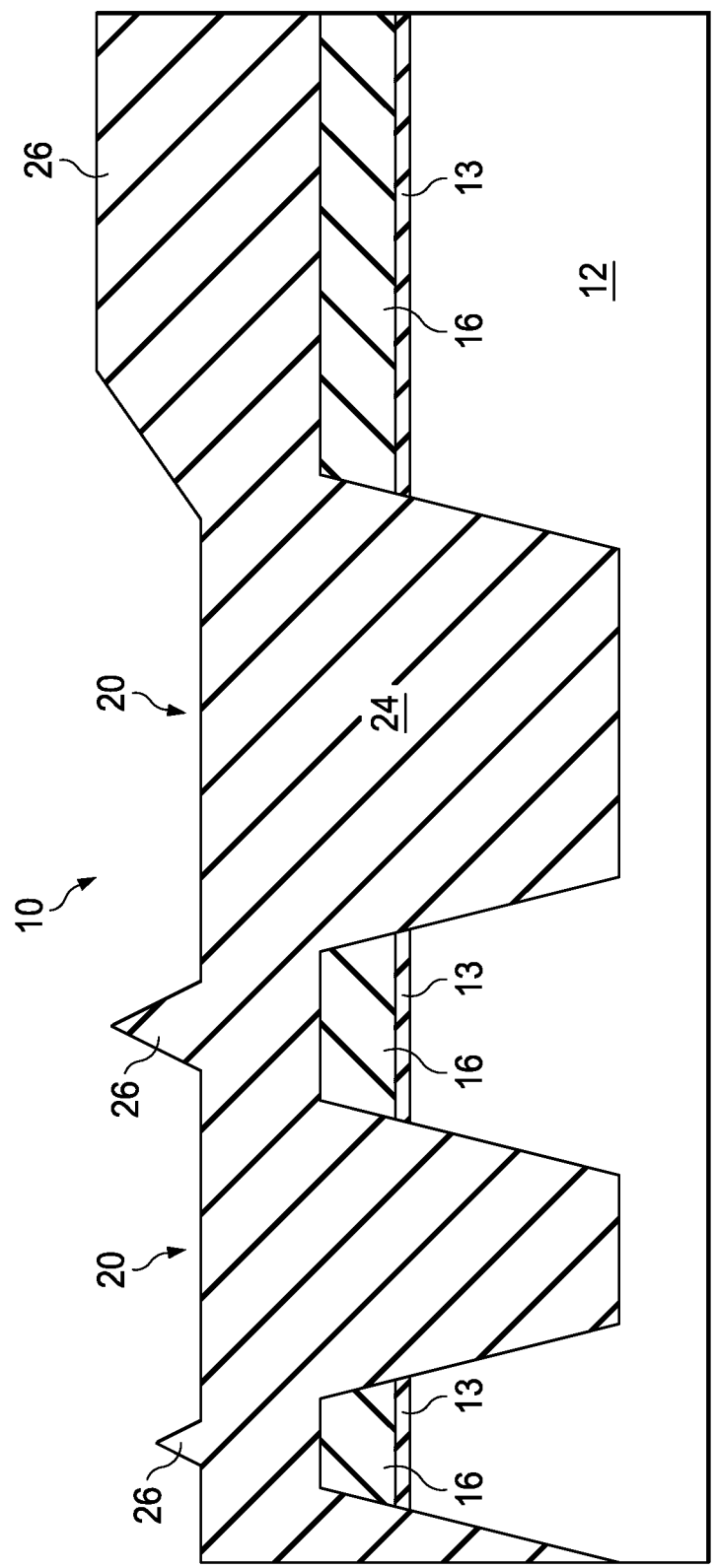

As shown in FIG. 3B, a trench oxide layer 24, e.g., silicon dioxide ($SiO_2$), is deposited over the structure, and extends into each trench 20 to form filled trenches. In some embodiments, the trench oxide layer 24 is deposited by High-Density Plasma Chemical Vapor Deposition (HDP CVD). As shown, the deposited trench oxide layer 24 may have a non-planar topography, e.g., due to the topography of the underlying structure. In particular, the topography of the trench oxide layer 24 may define a number of upwardly protruding or extending features or regions 26.

Figure 3C:
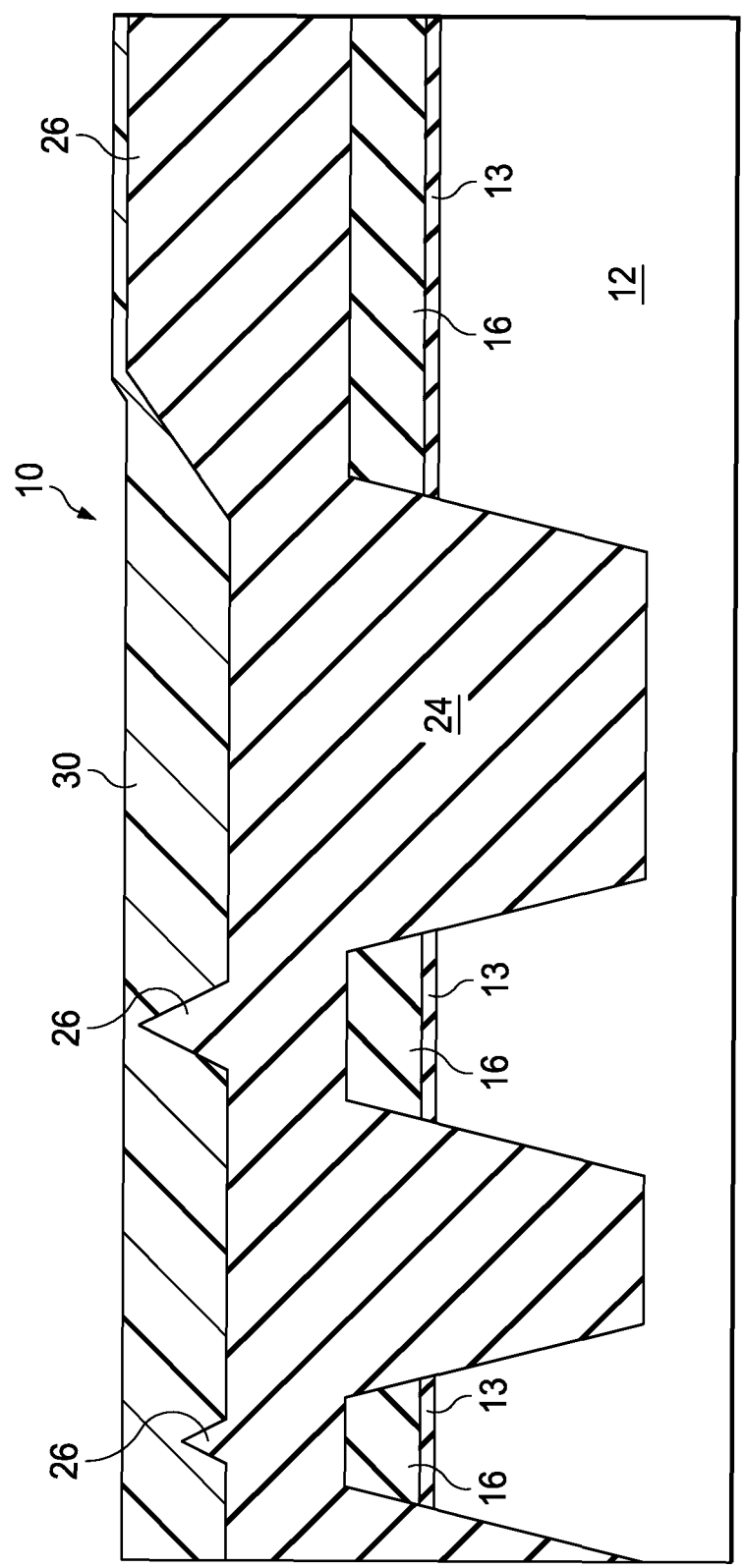

As shown in FIG. 3C, a sacrificial planarizing layer 30 is deposited over the trench oxide layer 24. The sacrificial planarizing layer 30 is etch-selective with respect to the trench oxide layer 24. In some embodiments, the planarizing layer comprises an organosilicate. For example, the planarizing layer 30 may comprise an organo-siloxane based polymer, e.g., an organo-siloxane based polymer with the chemical formula $R_xCH_{3,y}SiO_z$, where R is an organic chromophore. In example embodiments, the sacrificial planarizing layer 30 comprises a DUO™ 193 or DUO™ 248 anti-reflective coating, e.g., as discussed above with reference to FIG. 1A. The planarizing layer 30 may be deposited in any suitable manner. In some embodiments, planarizing layer 30 is spin-coated over the trench oxide layer 24, which provides a partially planarizing effect.

A series of etches are then performed to form the trench isolation structures in the trenches 20, as discussed below, which in the process of forming the trench isolation structures, removes the sacrificial planarizing layer 30 and decrease surface variations in the upper surface of the trench oxide layer 24, e.g., by reducing or eliminating the upwardly protruding or extending features or regions 26.

Figure 3D:
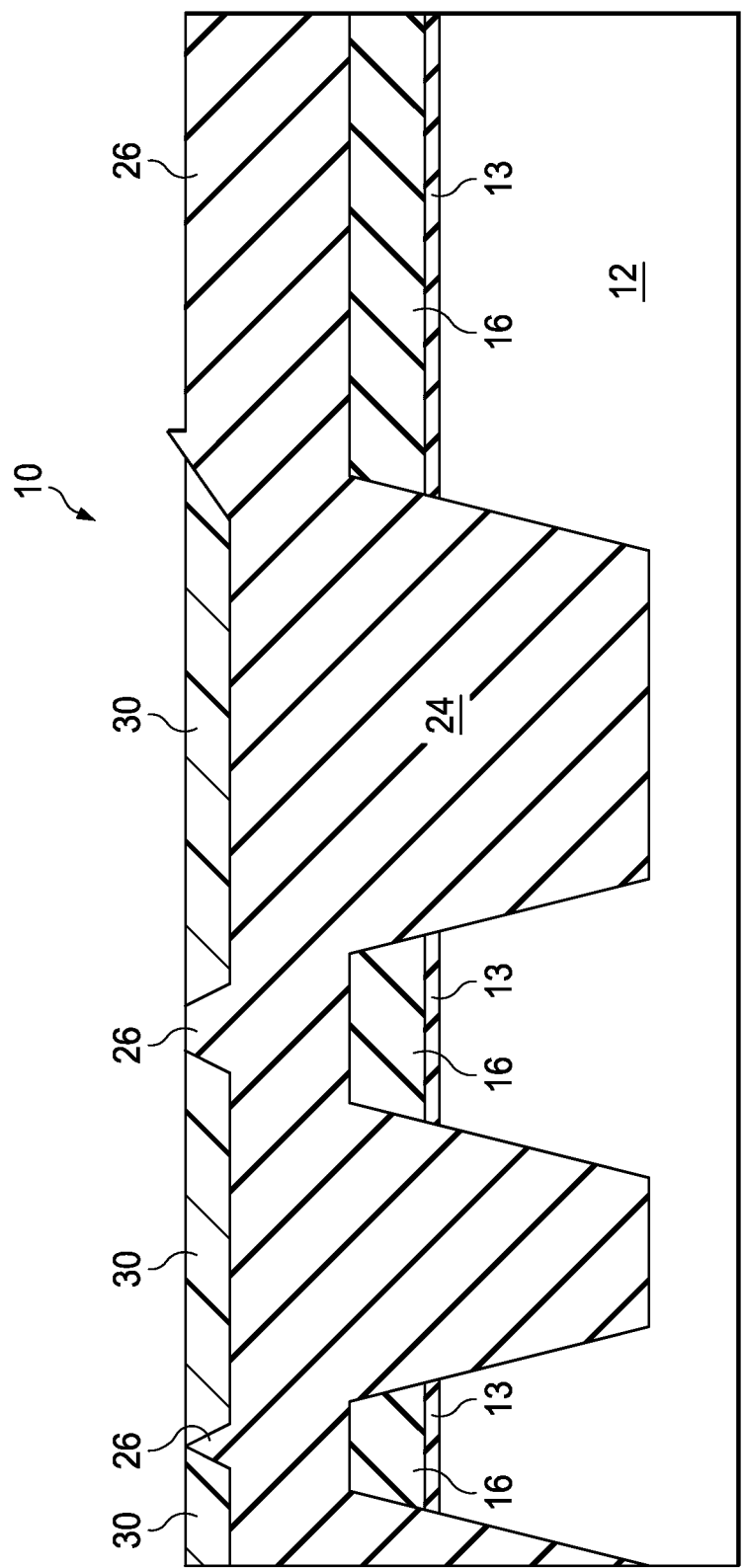

Referring to FIG. 3D, a generally non-selective etch (e.g., which, in embodiments that use a DUO™ coating, may be referred to as a DUO etch) is performed, which etches the trench oxide layer 24 and sacrificial planarizing layer 30, e.g., DUO™ coating (and nitride layer 16, if relevant) at the same or about the same rate. This generally non-selective etch may leave portions of the sacrificial planarizing layer 30 in low lying areas of the structure, e.g., above trenches 20, as shown in FIG. 3D. The etch may remove portions of the upwardly projecting oxide areas 26 of the trench oxide layer 24, while the lower field areas of the oxide layer 24 are protected by the sacrificial planarizing layer 30. In one embodiment, the second etch is stopped when the highest points 26 are about level with the bulk planarizing layer 30.

Figure 3E:
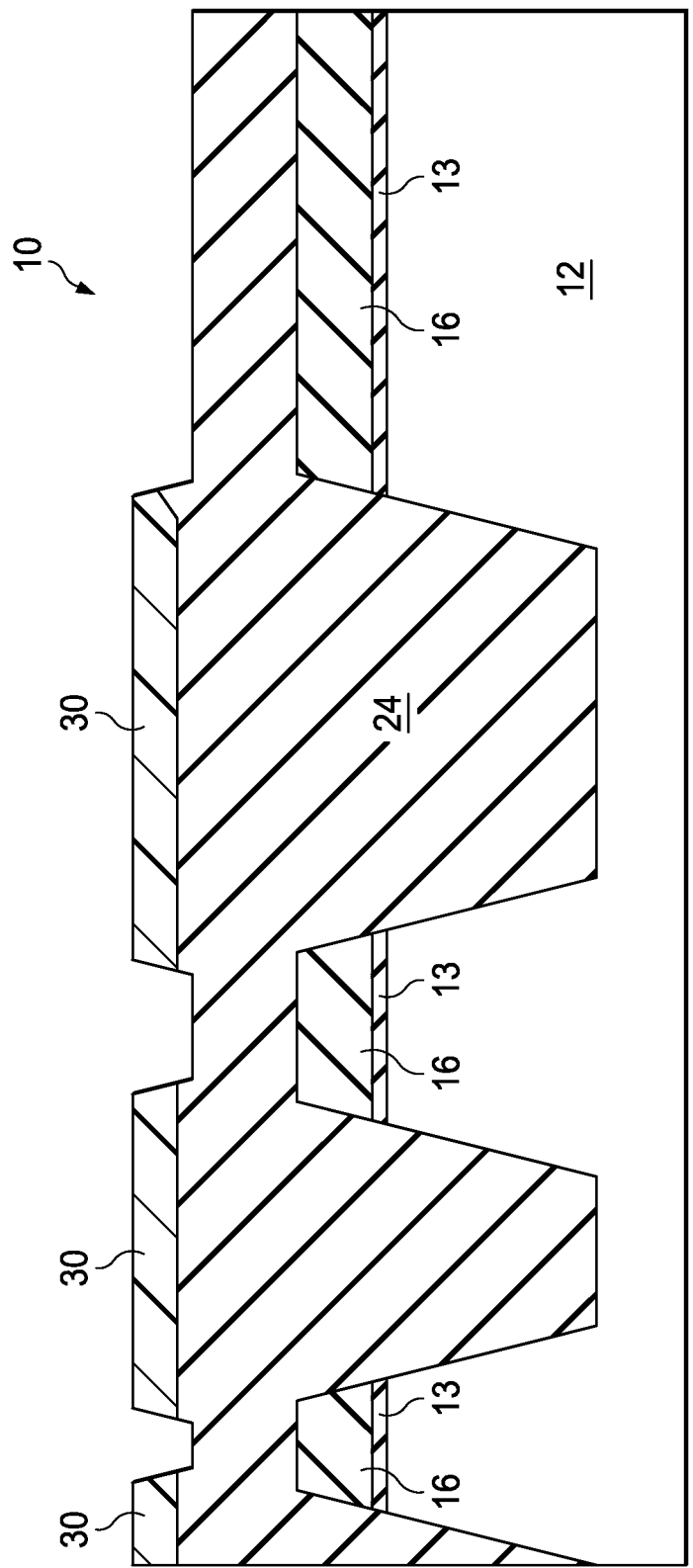

Referring to FIG. 3E, an oxide etch is performed that is selective to the trench oxide layer 24 over the sacrificial planarizing layer 30 and nitride layer 16. As shown, the oxide etch may leave sacrificial planarizing layer 30 over the trench areas, while regions 26 shown in FIG. 3D (e.g., above regions of nitride layer 16) are etched to a depth below the regions of sacrificial planarizing layer 30.

Figure 3F:
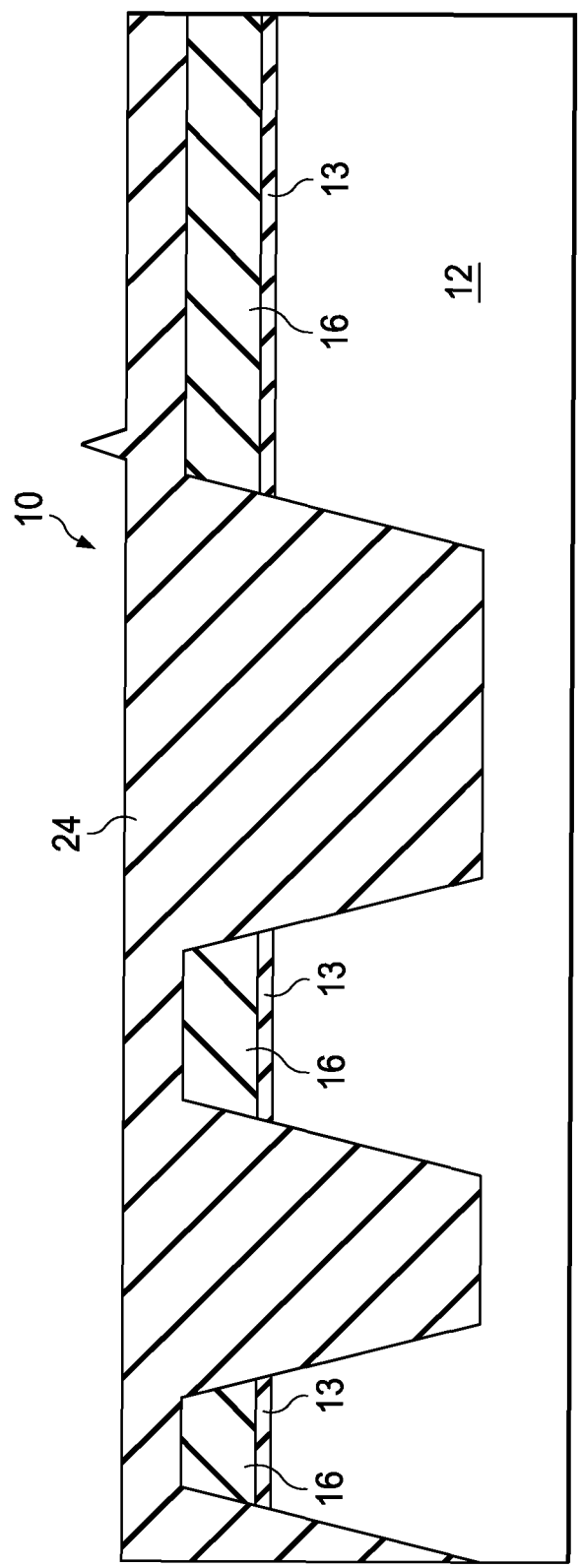

Referring to FIG. 3F, a second non-selective or generally non-selective clean-up etch is then performed, which may planarize and remove the remaining sacrificial planarizing layer 30 from all areas, in particular over the trenches 20 (field oxide). In some embodiments this etch may be stopped before reaching the nitride layer 16, as shown in FIG. 3E.

Figure 3G:
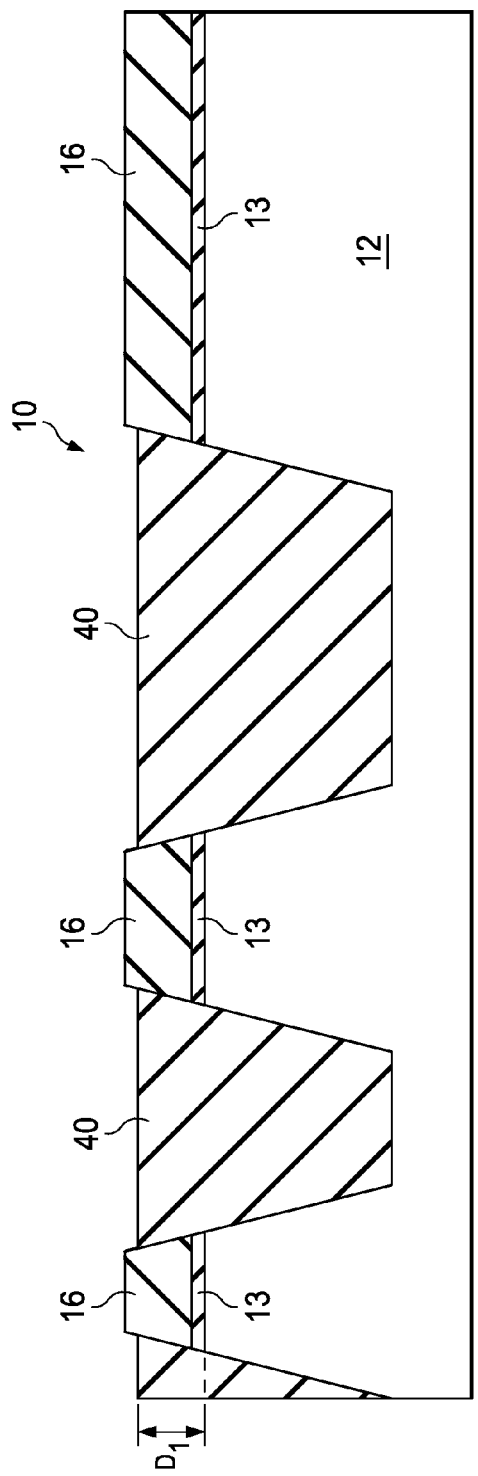

As shown in FIG. 3G, an oxide etch that is selective to the trench oxide layer 24 over the sacrificial planarizing layer 30 and nitride layer 16 is then performed to remove remaining portions of the trench oxide layer 24 outside the filled trenches 20, thereby defining a field oxide 40 in each trench 20. In some embodiments, a defined amount of over-etch is performed, which may trench the field oxides 40, thereby setting the final field oxide height, and clear any residue on the remaining nitride layer 16.

Figure 3H:
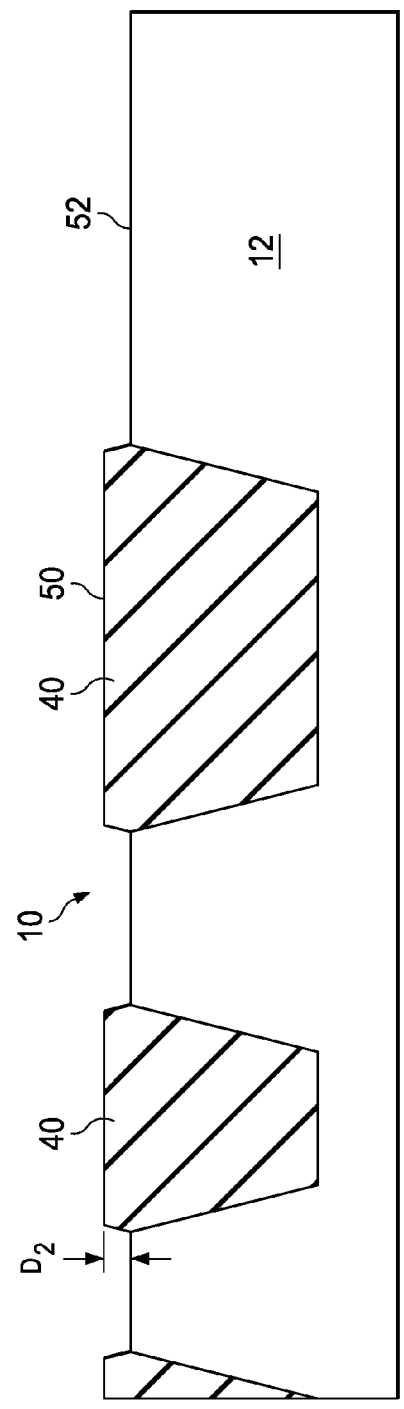

As shown in FIG. 3H, the nitride layer 16 is then removed using any suitable removal process, e.g., by an etch selective to the nitride layer 16 over the materials of the field oxide 40 and substrate 12 (e.g., an SiN etch). As shown, the remaining field oxides 40, i.e., trench isolation structures, may project above the exposed upper surface of the semiconductor substrate 12 by a targeted step height indicated at $D_2$, i.e., the height of the top surface of field oxide 40 relative to the top surface 52 of substrate 12. In some embodiments, step height $D_2$ and/or top shape of field oxides 40 may be controlled as desired by performing any suitable processes, e.g., plasma etch, wet etch, or by running a long wet removal process (e.g., wet SiN removal) to remove the remaining portions of the nitride layer 16.

Thus, in some embodiments, the trench isolation structures 40 (e.g., STIs) may be formed without using any chemical-mechanical planarization (CMP) process, which may provide various advantages as discussed above. The nitride removal step may also be performed in-situ with the rest of the planarizing etches, if the optional wet etch is skipped, thereby further reducing the total number of steps.

In some embodiments in which the oxide etch shown in FIG. 3G is skipped or is included in the planarizing etch process, the final nitride etch shown in FIG. 3H can be completed in-situ with the planarizing etch process.

Figure 4:
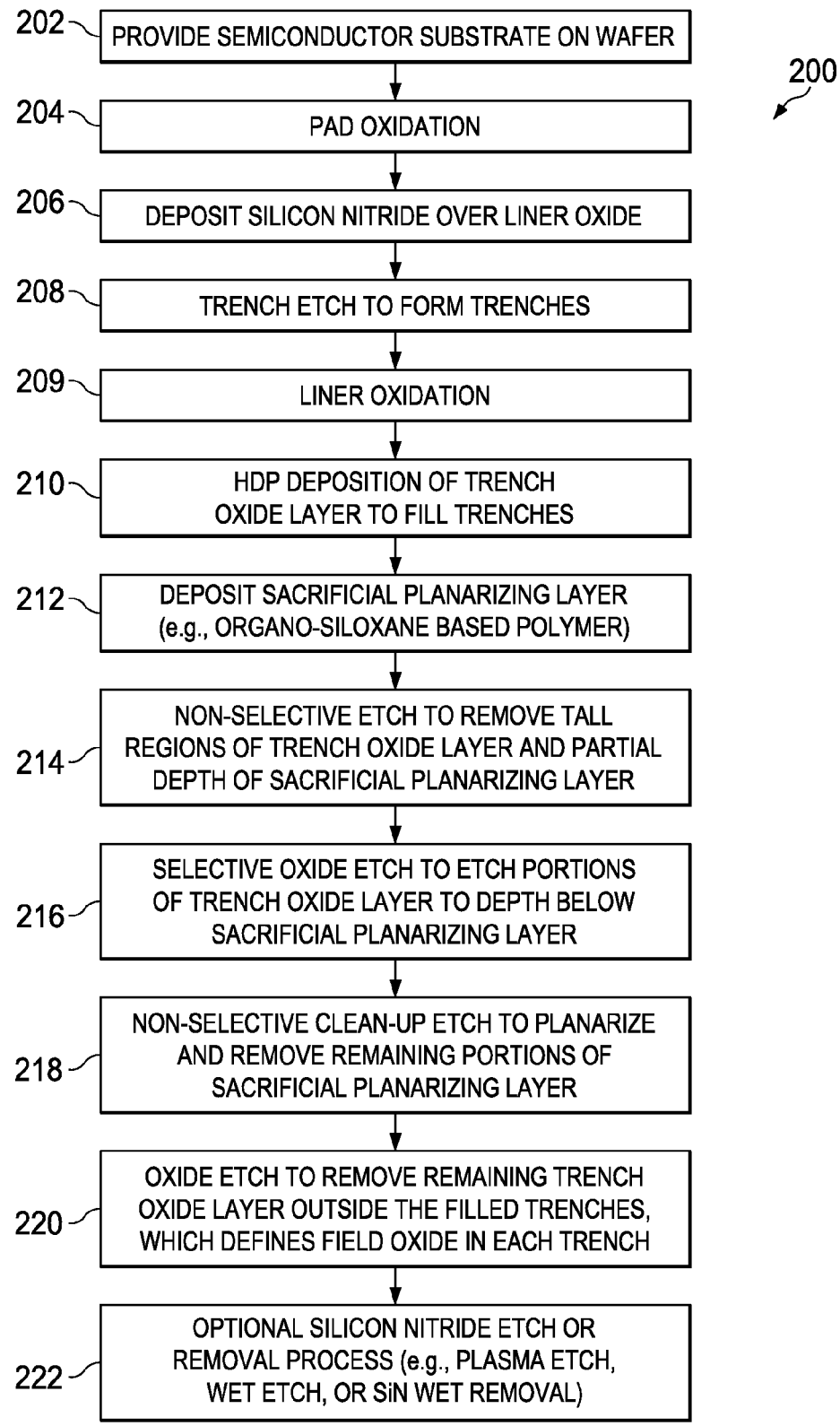
FIG. 4 is a flowchart of an example method of forming shallow trench isolations for an integrated circuit, e.g., CMOS device, corresponding to the process illustrated in FIGS. 3A-3H, according to an example embodiment.

FIG. 4 is a flowchart of an example method 200 of forming shallow trench isolations for an integrated circuit, e.g., CMOS device, according to an example embodiment corresponding to FIGS. 3A-3H.

Steps 202-210 At step 202, a silicon substrate is formed on a wafer. At step 204, a pad oxidation process forms a pad oxide over the surface of the silicon substrate. At step 206, a silicon nitride layer is deposited over the silicon substrate. At step 208, a trench etch, e.g., an STI etch, is performed to form a plurality of trenches. At step 209, a liner oxidation process forms a liner oxide in the formed trenches. At step 210, a silicon dioxide layer (trench oxide layer) is deposited over the wafer by High-Density Plasma Chemical Vapor Deposition (HDP CVD), which fills the etched trenches. The deposited silicon dioxide layer may have a non-planar topography, e.g., due to the topography of the underlying structure. In particular, the silicon dioxide layer may define a number of upwardly protruding or extending features or regions.

At step 112, a sacrificial planarizing layer of an organo-siloxane based polymer (e.g., DUO™ 193 or DUO™ 248) is deposited over the silicon dioxide layer. At step 214, a non-selective etch (e.g., DUO etch) is performed to remove tall or upwardly projecting regions of silicon dioxide layer and to remove a partial depth of the sacrificial planarizing layer. The etch at step 214 may at least partially etch the upwardly projecting areas of the silicon dioxide, while the lower areas of silicon dioxide are protected by the sacrificial planarizing layer. At step 216, a selective oxide etch is performed to etch portions of silicon dioxide layer to a depth below the remaining sacrificial planarizing layer. At step 218, a non-selective "clean-up" etch is performed to planarize the structure and remove any remaining portions of sacrificial planarizing layer, in particular over the trenches (field oxide). This etch may be stopped before reaching the underlying silicon nitride layer.

At step 220, an oxide etch that is highly selective to silicon dioxide is then performed to remove portions of the silicon dioxide layer above and outside the filled trenches, thereby defining a field oxide in each trench. In some embodiments, a defined amount of over-etch is performed, which may trench the field oxides and clear any residue on the remaining silicon nitride layer. At step 224, the silicon nitride layer is removed using any suitable removal process, e.g., SiN etch selective to silicon nitride over the silicon dioxide field oxide and the silicon substrate. The remaining field oxides, i.e., trench isolation structures, may project above the exposed upper surface of the silicon substrate by a targeted step height, which may be controlled or shaped as desired using any suitable finishing process(es).

Thus, in this manner, shallow trench isolations may be formed without using any chemical-mechanical planarization (CMP) process, which may provide various advantages as discussed above.

Although the disclosed embodiments are described in detail in the present disclosure, it should be understood that various changes, substitutions and alterations can be made to the embodiments without departing from their spirit and scope.

The invention claimed is:

1. A method of forming a trench isolation structure for an integrated circuit, the method comprising:
   forming a nitride layer over a semiconductor substrate;
   performing a trench etch process through portions of the nitride layer and the semiconductor substrate to form a trench;
   depositing a trench oxide layer over remaining portions of the nitride layer and extending into the trench to form a filled trench;
   depositing a sacrificial planarizing layer over the trench oxide layer, the sacrificial planarizing layer being etch-selective with respect to the trench oxide layer;
   performing a multi-step etch process that including:
      a planarizing etch process that removes the sacrificial planarizing layer and decreases surface variations in an upper surface of the trench oxide layer;
      wherein the planarizing etch process includes at least one selective etch that is either selective to the sacrificial planarizing layer with respect to the trench oxide layer or selective to the trench oxide layer with respect to the sacrificial planarizing layer; and
   removing the remaining portions of the nitride layer such that the remaining oxide of the filled trench defines a trench isolation structure that projects above an exposed upper surface of the semiconductor substrate.

2. The method according to claim 1, wherein multi-step etch process comprises:
   (a) the planarizing etch process that removes the sacrificial planarizing layer and decreases surface variations in an upper surface of the trench oxide layer; and
   (b) an oxide etch process that is selective to the trench oxide layer to remove remaining portions of the trench oxide layer outside the filled trench.

3. The method according to claim 2, wherein:
   the trench etch process forms a plurality of trenches;
   the trench oxide layer is deposited into the plurality of trenches to form a plurality of filled trenches;
   the oxide etch process removes remaining portions of the trench oxide layer outside the plurality of filled trenches; and
   the nitride removal process removes the remaining portions of the nitride layer such that the remaining oxide of each of the plurality of filled trenches defines a trench isolation structure that projects above an exposed upper surface of the semiconductor substrate.

4. The method according to claim 2, wherein the planarizing etch process includes:
   a first etch that is selective to the planarizing layer relative to the trench oxide layer;
   a second etch that is selective to the trench oxide layer relative to the planarizing layer; and
   a non-selective third etch that removes the trench oxide layer and the planarizing layer at similar rates until the planarizing layer is removed.

5. The method according to claim 2, wherein the oxide etch process is performed until a top surface of the oxide-filled trench is etched down to a predefined distance below a top surface of the remaining portions of the nitride layer adjacent the oxide-filled trench.

6. The method according to claim 2, wherein the oxide etch process is performed until a top surface of the oxide-filled trench is etched down to a predefined distance above a top surface of the semiconductor substrate adjacent the oxide-filled trench.

7. The method according to claim 1, wherein:
the multi-step etch process comprises a multi-step planarizing etch process; and
the step of removing the remaining portions of the nitride layer is performed by the multi-step planarizing etch process.

8. The method according to claim 7, wherein multi-step etch process comprises a four-step planarizing etch process.

9. The method according to claim 7, wherein the multi-step planarizing etch process includes an etch selective to oxide which is performed until a top surface of the oxide-filled trench is etched down to a predefined distance above a top surface of the semiconductor substrate adjacent the oxide-filled trench.

10. The method according to claim 1, wherein the planarizing layer comprises an organosilicate.

11. The method according to claim 1, wherein the planarizing layer comprises an organo-siloxane based polymer.

12. The method according to claim 1, wherein the organosilicate comprises an organo-siloxane based polymer comprising an organic chromophore.

13. The method according to claim 1, wherein the planarizing layer is spin-coated over the deposited oxide.

14. The method according to claim 1, wherein the method is performed without a chemical-mechanical planarization (CMP) process.

15. The method according to claim 1, wherein forming the nitride layer over a semiconductor substrate comprises forming a thin pad oxide over the semiconductor substrate and subsequently forming the nitride layer over the thin pad oxide.

16. The method according to claim 1, wherein the planarizing etch process includes:
performing the at least one selective etch that is either selective to the sacrificial planarizing layer with respect to the trench oxide layer or selective to the trench oxide layer to the sacrificial planarizing layer, wherein the at least one selective etch removes only a portion of the sacrificial planarizing layer; and
after the at least one selective etch, performing a non-selective etch that removes the trench oxide layer and the planarizing layer at similar rates until remaining portions of the planarizing layer are removed.

* * * * *